United States Patent
Mason et al.

(10) Patent No.: US 9,793,086 B2
(45) Date of Patent: *Oct. 17, 2017

(54) SIC COATING IN AN ION IMPLANTER

(71) Applicant: Varian Semiconductor Equipment Associates, Inc., Gloucester, MA (US)

(72) Inventors: Robert J. Mason, Brentwood, NH (US); Shardul S. Patel, Chelmsford, MA (US); Robert H. Bettencourt, Gloucester, MA (US); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/175,501

(22) Filed: Jun. 7, 2016

(65) Prior Publication Data

US 2016/0293378 A1    Oct. 6, 2016

Related U.S. Application Data

(63) Continuation of application No. 14/039,654, filed on Sep. 27, 2013, now Pat. No. 9,384,937.

(51) Int. Cl.
*H01J 37/08* (2006.01)
*H01J 37/317* (2006.01)
*H01J 37/12* (2006.01)

(52) U.S. Cl.
CPC .............. *H01J 37/08* (2013.01); *H01J 37/12* (2013.01); *H01J 37/3171* (2013.01);
(Continued)

(58) Field of Classification Search
CPC ............ H01J 2237/022; H01J 2237/061; H01J 2237/083; H01J 37/08; H01J 37/12; H01J 37/3171

See application file for complete search history.

(56) References Cited

U.S. PATENT DOCUMENTS 5,293,045 A  *  3/1994  Miyoshi .................. H01J 37/12
                                                        250/396 R
5,343,047 A  *  8/1994  Ono ....................... H01J 37/3171
                                                        250/251

(Continued)

FOREIGN PATENT DOCUMENTS

CN      102301453 A     12/2011
CN      102934195 A     2/2013
WO      93/18201 A1     9/1993

OTHER PUBLICATIONS

International Search Report and Written Opinion dated Jan. 21, 2015 in corresponding PCT application No. PCT/US2014/057201.
"CVD Silicon Carbide" Rohm and Haas, Sep. 2000.

*Primary Examiner* — Wyatt Stoffa
(74) *Attorney, Agent, or Firm* — Nields, Lemack & Frame, LLC

(57) ABSTRACT

An ion implanter has a coating of low resistivity silicon carbide on one or more of the conductive surfaces that are exposed to ions. For example, ions are generated in an ion source chamber, and the interior surfaces of the walls are coated with low resistivity silicon carbide. Since silicon carbide is hard and resistant to sputtering, this may reduce the amount of contaminant ions that are introduced into the ion beam that is extracted from the ion source chamber. In some embodiments, the extraction electrodes are also coated with silicon carbide to reduce the contaminant ions introduced by these components.

14 Claims, 1 Drawing Sheet

(52) U.S. Cl.
CPC ... *H01J 2237/022* (2013.01); *H01J 2237/061* (2013.01); *H01J 2237/083* (2013.01)

(56) References Cited

U.S. PATENT DOCUMENTS

| | | | | |
|---|---|---|---|---|
| 5,444,256 A | * | 8/1995 | Nagai | H01J 37/12 250/396 R |
| 6,214,755 B1 | | 4/2001 | Otsuki et al. | |
| 6,331,713 B1 | | 12/2001 | Smick et al. | |
| 6,710,338 B2 | * | 3/2004 | Gerlach | H01J 37/08 250/306 |
| 6,805,952 B2 | * | 10/2004 | Chang | C23C 4/00 118/723 R |
| 6,929,720 B2 | * | 8/2005 | Reynolds | C23C 14/358 204/192.3 |
| 7,992,518 B2 | * | 8/2011 | Wu | C23C 16/325 118/723 E |
| 9,384,937 B2 | | 7/2016 | Mason et al. | |
| 2008/0160170 A1 | * | 7/2008 | Miller | H01J 37/32018 427/8 |
| 2008/0169183 A1 | * | 7/2008 | Hertel | H01J 37/32412 204/164 |
| 2008/0223409 A1 | * | 9/2008 | Horsky | B08B 7/00 134/22.1 |
| 2009/0084988 A1 | * | 4/2009 | Blake | H01J 37/20 250/492.21 |
| 2009/0166565 A1 | * | 7/2009 | Alcott | H01J 37/05 250/492.21 |
| 2009/0314951 A1 | | 12/2009 | Biloiu et al. | |
| 2010/0140508 A1 | * | 6/2010 | Blake | H01J 37/3171 250/492.21 |
| 2010/0200768 A1 | * | 8/2010 | Buff | H01J 27/024 250/424 |
| 2011/0226422 A1 | * | 9/2011 | Kwan | H01J 27/16 156/345.48 |
| 2011/0259269 A1 | * | 10/2011 | Biloiu | H01J 27/16 118/723 I |
| 2012/0000421 A1 | * | 1/2012 | Miller | C23C 14/48 118/712 |
| 2012/0056101 A1 | * | 3/2012 | Kikuchi | H01J 27/20 250/424 |
| 2012/0085917 A1 | * | 4/2012 | Kurunczi | H01J 37/026 250/396 ML |
| 2012/0286152 A1 | * | 11/2012 | Jones | H01J 49/145 250/282 |
| 2013/0108863 A1 | * | 5/2013 | Cooke | H01J 37/16 428/336 |
| 2013/0260544 A1 | * | 10/2013 | Koo | C23C 14/48 438/527 |
| 2014/0042337 A1 | * | 2/2014 | Biloiu | H01J 27/16 250/424 |
| 2014/0097752 A1 | * | 4/2014 | Biloui | H01J 37/32119 315/111.81 |
| 2014/0110607 A1 | | 4/2014 | Torregrosa et al. | |
| 2014/0231669 A1 | * | 8/2014 | Takahashi | H01J 27/18 250/424 |
| 2014/0327358 A1 | * | 11/2014 | Torregrosa | C23C 14/48 315/111.21 |
| 2015/0090897 A1 | | 4/2015 | Mason et al. | |

* cited by examiner

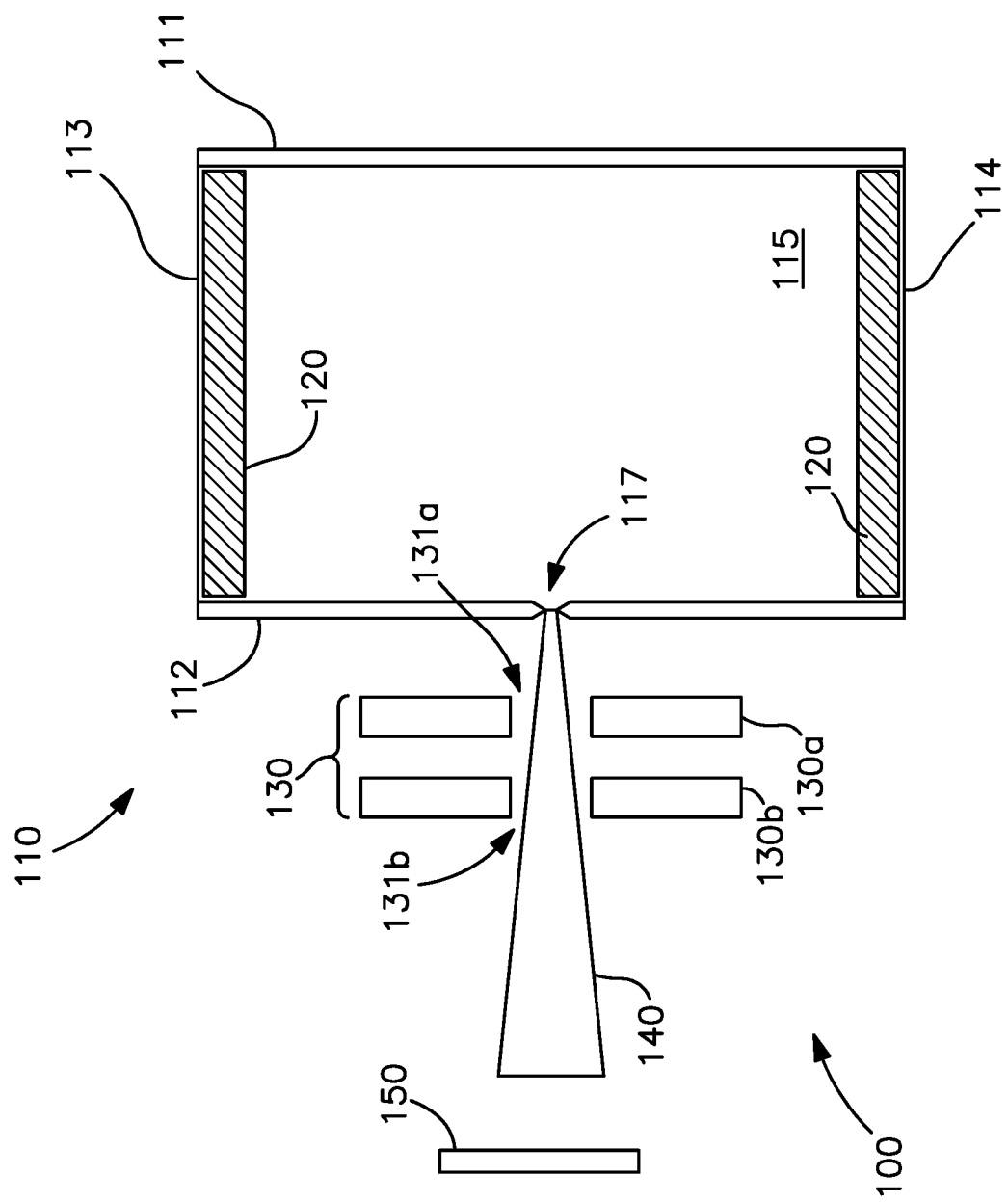

SIC COATING IN AN ION IMPLANTER

This application is a continuation of U.S. patent application Ser. No. 14/039,654 filed Sep. 27, 2013, the disclosure of which is incorporated herein by reference in its entirety.

FIELD

This invention relates to ion implantation and, more particularly, to reducing contaminants generated in an ion implanter.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Ion implantation has been demonstrated as a viable method to dope solar cells. Use of ion implantation removes process steps needed for existing technology, such as diffusion furnaces. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs.

One issue associated with ion implantation may be the introduction of undesirable contaminants. These contaminants may decrease the efficiency or operation of the solar cell. Therefore, any technique or system that reduces the generation of these contaminants may be advantageous. This may accelerate the adoption of solar cells as an alternative energy source.

SUMMARY

An ion implanter has a coating of low resistivity silicon carbide on one or more of the conductive surfaces that are exposed to ions. For example, ions are generated in an ion source chamber, and the interior surfaces of the walls are coated with low resistivity silicon carbide. Since silicon carbide is hard and resistant to sputtering, this may reduce the amount of contaminant ions that are introduced into the ion beam that is extracted from the ion source chamber. In some embodiments, the extraction electrodes are also coated with silicon carbide to reduce the contaminant ions introduced by these components.

In one embodiment, an ion implanter is disclosed. The ion implanter comprises an ion source comprising an ion source chamber having a first wall, an opposite conductive second wall and a plurality of conductive side walls, where an extraction aperture is disposed in the second wall; and an extraction electrode assembly disposed proximate the extraction aperture and outside the ion source chamber, the extraction electrode assembly comprising one or more conductive electrodes; wherein at least one conductive component is coated with low resistivity silicon carbide.

According to a second embodiment, an ion implanter is disclosed. The ion implanter comprises an ion source comprising an ion source chamber having a first wall, an opposite conductive second wall and a plurality of conductive side walls, where an extraction aperture is disposed in the second wall; a plurality of conductive liners, each disposed against and in electrically communication with a respective interior surface of the conductive side walls; and an extraction electrode assembly disposed proximate the extraction aperture and outside the ion source chamber, the extraction electrode assembly comprising one or more conductive electrodes; wherein at least one of the conductive liners, an interior surface of the second wall and the extraction electrode assembly is coated with low resistivity silicon carbide.

According to a third embodiment, an ion implanter comprises an ion source comprising an ion source chamber having a first wall, an opposite conductive second wall and a plurality of conductive side walls, where an extraction aperture is disposed in the second wall; a plurality of conductive graphite liners, each disposed against and in electrically communication with a respective interior surface of the conductive side walls, each of the liners comprising a first surface facing an interior of the ion source chamber and an opposite second surface facing a respective sidewall, wherein the first surface is coated with low resistivity silicon carbide; and an extraction electrode assembly disposed proximate the extraction aperture and outside the ion source chamber, the extraction electrode assembly comprising one or more conductive electrodes, each having a respective aperture, wherein a portion of each electrode surrounding the respective aperture is coated with low resistivity silicon carbide; wherein the low resistivity silicon carbide has a resistivity of less than 1 ohm-cm.

BRIEF DESCRIPTION OF THE DRAWINGS

For a better understanding of the present disclosure, reference is made to the accompanying drawings, which are incorporated herein by reference and in which:

FIG. 1 is an ion implanter in accordance with a first embodiment.

DETAILED DESCRIPTION

These methods are described herein in connection with an ion implanter. However, these methods can be used with other systems and processes involved in semiconductor manufacturing or other systems that use a plasma or an ion beam. Thus, the invention is not limited to the specific embodiments described below.

FIG. 1 shows a cross section of a representative ion implanter, which may be used to introduce dopant ions into a workpiece 150, such as a solar cell. These dopant ions are used to form the emitter region and p-n junction needed in a solar cell. The ion implanter 100 includes an ion source 110. The ion source 110 may comprise a first wall 111, and an opposite second wall 112. The first wall 111 and the second wall 112 may be joined together by a plurality of side walls 113, 114. Since the ion implanter is shown in cross section, only two side walls 113, 114 are shown. However, any number of side walls, such as four or more, may also be employed. These side walls 113, 114 are mechanically and electrically coupled to the second wall 112. These side walls 113, 114 are also mechanically coupled to the first wall 111. The interior surfaces of these sides 111-114 define an ion source chamber 115.

Additionally, although the ion source 110 is illustrated as a box, having size planar walls, other configurations are also possible.

Typically, the ion source 110 has a plasma generator (not shown), such as an RF antenna or an indirectly heated cathode (ISC), that supplies the energy needed to create a plasma and ionize the source gas within the ion source 110. In some embodiments, the plasma generator is disposed proximate the first wall 111, on the outside of the ion source chamber 115. The first wall 111 may be constructed of a dielectric material, such as silicon oxide. The second wall 112 and the side walls 113, 114 may be constructed of a conductive material, such as a metal or graphite, such that a common bias voltage may be applied to these walls. In other words, the ion source chamber 115 may be made up of a first wall 111, an opposite conductive second wall 112, and conductive side walls 113, 114.

A source gas is fed into the ion source 110. The plasma generator creates a plasma and creates ions of this source gas. An extraction aperture 117 may be disposed on the second wall 112, such that the ions generated within the ion source chamber 115 may be extracted through this extraction aperture 117.

Disposed outside the ion source chamber 115, proximate the extraction aperture 117, is an extraction electrode assembly 130, comprising one or more electrodes. For example, as shown in FIG. 1, two electrodes, an extraction electrode 130a and a suppression electrode 130b, may be arranged proximate the extraction aperture 117. Of course, the extraction electrode assembly 130 may comprise any number of electrodes and is not limited to this embodiment. The electrodes that make up the extraction electrode assembly 130 may be conductive and are typically constructed from graphite.

In operation, a negative bias voltage is applied to the extraction electrode 130a, which attracts positive ions from the ion source chamber 115. A different bias voltage is typically applied to the suppression electrode 130b. The extraction electrode 130a and the suppression electrode 130b each have a respective electrode aperture 131a, 131b disposed therein. The extraction electrode aperture 131a and the suppression electrode aperture 131b are each aligned with the extraction aperture 117, such that ions are attracted toward the extraction electrode assembly 130. These attracted ions then pass through the electrode apertures 131a,b disposed in the electrodes 130a,b. These ions form an ion beam 140 that impacts the workpiece 150.

To reduce costs, it may be common not to mass analyze the ions that exit the ion source chamber 115 and form the ion beam 140. In other words, all of the ions that are generated in the ion source chamber 115, which include the desired dopant ions, but may also include contaminant ions, such as those generated from the surfaces within the chamber, impact the workpiece 150. In addition, contaminants from the extraction electrode assembly 130 may also be contained in the ion beam 140.

For this reason, one or more interior surfaces of the ion source chamber 115 may be lined so as to reduce or eliminate the exposure of those interior surfaces to the plasma. These liners 120 may reduce the contaminants that are created by material sputtering from these interior surfaces. Additionally, as described above, without the use of a liner 120, the energetic ions within the ion source chamber 115 may impact these interior surfaces and cause contaminants to become detached from these surfaces. As stated above, the second wall 112 and the side walls 113, 114 of the ion source 110 may be made of a conductive material. Therefore, the liners 120 used to cover the interior surfaces of these walls may also be conductive. These liners 120 are disposed against and are in electrical communication with the interior surfaces of these walls, such as side walls 113, 114. In some embodiments, these liners 120 are constructed from graphite, which has a resistivity of about 0.001 ohm-cm. These liners 120 may be disposed against all of the interior surfaces of side walls 113, 114. In addition, a liner 120 may be disposed on a portion of the interior surface of second wall 112. If a liner 120 is disposed on the second wall 112, the liner 120 does not cover extraction aperture 117.

However, it has been found that, even with the addition of graphite liners 120, contaminant ions may still impact the workpiece 150. In some embodiments, these contaminant ions may comprise carbon. These carbon ions may be caused by the graphite liners 120, or the electrodes 130a, 130b.

Typically, silicon carbide has a resistivity of about 100 ohm-cm. In comparison, as stated above, the resistivity of graphite is about 0.001 ohm-cm. Therefore, traditional silicon carbide cannot be used in applications which require a conductive surface, such as the second wall 112 and side walls 113, 114 in the ion source chamber 115 and the electrodes in the extraction electrode assembly 130.

Recently, advances in material science have made possible a silicon carbide material with greatly reduced resistivity. In some embodiments, this resistivity may be between 0.01 and 1 ohm-cm. Although not nearly as conductive as graphite, this low resistivity silicon carbide may be used in some of the applications described herein.

For example, in one embodiment, the graphite liners 120 may be coated with low resistivity silicon carbide. In one embodiment, the low resistivity silicon carbide is applied to the graphite liners 120 using a chemical vapor deposition (CVD) process. The liner 120 has a first surface which faces the interior of the ion source chamber 115, and an opposite second side, which faces the side wall 113,114. In some embodiments, the low resistivity silicon carbide may be applied to both surfaces of the liner 120. In another embodiment, the low resistivity silicon carbide is only applied to the first surface of the liner 120 that faces the interior of the ion source chamber 115. After the low resistivity silicon carbide is coated on the graphite liners 120, the liners 120 are installed against the interior surface of side walls 113, 114 of the ion source chamber 115. Since the low resistivity silicon carbide has relatively good conductivity, the bias voltage can still be applied to these liners 120.

In some cases, the interior surface of second wall 112 of the ion source chamber 115 is also coated with the low resistivity silicon carbide. For example, the second wall 112 may be coated with the low resistivity silicon carbide using CVD. In some embodiments, both surfaces of the second wall 112 (i.e. the interior surface which faces the ion source chamber 115 and the exterior surface) are both coated with low resistivity silicon carbide. In some embodiments, the low resistivity silicon carbide is not applied to the outer border of the inner surface of the second wall 112. For example, an uncoated border of about 1 inch may be disposed about the interior surface of the second wall 112. In this way, when the side walls 113, 114 are attached to the second wall 112, the side walls 113, 114 are in direct contact with the second wall 112, without an intervening layer of silicon carbide. This may help improve the electrical connection between the second wall 112 and the side walls 113, 114. In other embodiments, the side walls 113, 114 may extend beyond the second wall 112, such that a portion of the interior surface of the side walls 113, 114 mates with the end of the second surface 112. In this embodiment, the portion of the interior surface of the side walls 113, 114 may not be coated or lined. Thus, silicon carbide is not disposed in the regions where the second wall 112 and the side walls 113, 114 are attached. In some embodiments, the exterior surface of the second wall 112 (i.e. the side outside of ion source chamber 115) may not be lined with low resistivity silicon carbide.

Thus, the contaminants that originate from within the ion source chamber 115 may be reduced by the application of a low resistivity silicon carbide coating on one or more of the interior surfaces of the walls that make up the ion source chamber 115. In some embodiments, only the liners 120 are coated with low resistivity silicon carbide. In other embodiments, only the interior side of the second wall 112 is coated. In other embodiments, all interior surfaces, except the first wall, are coated with low resistivity silicon carbide.

In other embodiment, liners 120 are not used in the ion source chamber 115. Instead, the low resistivity silicon carbide is applied directly to the interior surfaces of side walls 113, 114. However, in both embodiments, the surfaces that ultimately face the interior of the ion source chamber 115 (which may be either the first surface of the liners 120 or the interior surface of the walls 113,114) are coated with low resistivity silicon carbide. In some cases, these surfaces may be the liners 120. In other cases, these surfaces may be the interior surfaces of the side walls 113, 114.

In some embodiments, the extraction electrode 130a and the suppression electrode 130b may be coated with low resistivity silicon carbide. In some embodiments, both surfaces of the electrodes 130a, 130b are coated using a CVD process. In another embodiment, only the surface of each electrode 130a, 130b that faces the ion beam 140 is coated. In yet another embodiment, a portion of both surfaces of the electrodes 130a, 130b is coated, however, this coating is limited to the region surrounding the electrode apertures 131a, 131b.

While FIG. 1 shows an electrode assembly 130 to direct the ion beam 140, other focusing elements may also be employed. These focusing elements may include electrodes or other structures. Although not shown, one or more surfaces of these focusing elements may be coated with low resistivity silicon carbide to reduce the amount of contaminants that strikes the workpiece 150.

Silicon carbide is described as it is known for its hardness and resistance to etching or sputtering. However, the disclosure is not limited to this material. For example, other hard materials which may be modified so as to have a resistivity of 1 ohm-cm or less can be employed in order to perform in these applications.

Thus, a higher purity ion beam may be produced by coating one or more conductive surfaces in the ion implanter using low resistivity silicon carbide. This low resistivity silicon carbide may be more resistant to sputtering, thereby producing fewer contaminant ions than the underlying surfaces would otherwise produce. In system without mass analysis, this reduction in contaminant ions may be highly beneficial.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter, comprising:
    an ion source comprising an ion source chamber having a first wall, an opposite conductive second wall and a plurality of conductive side walls, where an extraction aperture is disposed in said conductive second wall; and
    a plurality of conductive liners, each disposed against and in electrical communication with a respective interior surface of said conductive side walls;
    wherein the conductive second wall and side walls are in communication with a first bias voltage; and
    wherein at least one of said conductive liners is coated with low resistivity silicon carbide.

2. The ion implanter of claim 1, wherein said low resistivity silicon carbide has a resistivity of less than 1 ohm-cm.

3. The ion implanter of claim 1, wherein an interior surface of said conductive second wall is coated with said low resistivity silicon carbide.

4. The ion implanter of claim 1, further comprising an extraction electrode assembly disposed proximate said extraction aperture and outside said ion source chamber, said extraction electrode assembly comprising one or more conductive electrodes in communication with one or more second bias voltages to attract ions from the ion source chamber through the extraction aperture, and
    wherein a surface of said one or more conductive electrodes is coated with said low resistivity silicon carbide.

5. The ion implanter of claim 4, wherein each of said one or more conductive electrodes comprise a respective aperture, and a portion of at least one of said one or more conductive electrodes surrounding said respective aperture is coated with said low resistivity silicon carbide.

6. An ion implanter, comprising:
    an ion source comprising an ion source chamber having a first wall, an opposite conductive second wall and a plurality of conductive side walls, where an extraction aperture is disposed in said conductive second wall; and
    an extraction electrode assembly disposed proximate said extraction aperture and outside said ion source chamber, said extraction electrode assembly comprising one or more conductive electrodes;
    wherein the conductive second wall and the plurality of conductive side walls are in communication with a first bias voltage and the one or more conductive electrodes are in communication with one or more second bias voltages, wherein a voltage difference between the first bias voltage and the second bias voltage serves to attract positive ions from the ion source chamber through the extraction aperture;
    wherein at least one of an interior surface of said conductive second wall, an interior surface of one of the plurality of side walls and said extraction electrode assembly is coated with low resistivity silicon carbide; and wherein said low resistivity silicon carbide has a resistivity of less than 1 ohm-cm.

7. The ion implanter of claim 6, further comprising a plurality of conductive liners, each disposed against and in electrical communication with a respective interior surface of said conductive side walls.

8. The ion implanter of claim 7, wherein said plurality of conductive liners each comprise a first surface facing an interior of said ion source chamber and an opposite second surface facing a respective sidewall, and said first surface is coated with low resistivity silicon carbide.

9. The ion implanter of claim 6, wherein said interior surface of said conductive second wall is coated with said low resistivity silicon carbide.

10. The ion implanter of claim 6, wherein a surface of said one or more conductive electrodes is coated with said low resistivity silicon carbide.

11. The ion implanter of claim 10, wherein each of said one or more conductive electrodes comprise a respective aperture, and a portion of at least one of said one or more conductive electrodes surrounding said respective aperture is coated with said low resistivity silicon carbide.

12. An ion implanter, comprising:
an ion source comprising an ion source chamber having a first wall, an opposite conductive second wall and a plurality of conductive side walls, where an extraction aperture is disposed in said conductive second wall;
a plurality of conductive liners, each disposed against and in electrical communication with a respective interior surface of said conductive side walls, each of said liners comprising a first surface facing an interior of said ion source chamber and an opposite second surface facing a respective sidewall, wherein said first surface is coated with low resistivity silicon carbide; and
an extraction electrode assembly disposed proximate said extraction aperture and outside said ion source chamber, said extraction electrode assembly comprising one or more conductive electrodes, each having a respective aperture, wherein a portion of at least one electrode surrounding said respective aperture is coated with low resistivity silicon carbide;
wherein said low resistivity silicon carbide has a resistivity of less than 1 ohm-cm;
and wherein the conductive side walls are in communication with a first bias voltage and the one or more conductive electrodes are in communication with one or more second bias voltages to attract ions from the ion source chamber through the extraction aperture.

13. The ion implanter of claim 12, wherein an interior surface of said conductive second wall is coated with said low resistivity silicon carbide.

14. The ion implanter of claim 13, wherein a region where said conductive second wall and said conductive side walls attach is not coated with said low resistivity silicon carbide.

* * * * *